(12) United States Patent
Kodama (10) Patent No.: US 12,178,048 B2
(45) Date of Patent: Dec. 24, 2024

(54) MEMORY DEVICE WITH SEMICONDUCTOR LAYER ON ISOLATION STRUCTURE

(71) Applicant: KIOXIA CORPORATION, Tokyo (JP)

(72) Inventor: Takenori Kodama, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 402 days.

(21) Appl. No.: 17/475,685

(22) Filed: Sep. 15, 2021

(65) Prior Publication Data
US 2022/0302142 A1 Sep. 22, 2022

(30) Foreign Application Priority Data

Mar. 18, 2021 (JP) ................. 2021-044592

(51) Int. Cl.
| | |
|---|---|
| H01L 27/1157 | (2017.01) |
| H01L 27/11565 | (2017.01) |
| H01L 29/66 | (2006.01) |
| H01L 29/792 | (2006.01) |
| H01L 49/02 | (2006.01) |
| H10B 43/10 | (2023.01) |
| H10B 43/35 | (2023.01) |
| H01L 29/788 | (2006.01) |
| H10B 41/10 | (2023.01) |
| H10B 41/35 | (2023.01) |

(52) U.S. Cl.
CPC ............. *H10B 43/35* (2023.02); *H01L 28/20* (2013.01); *H01L 28/75* (2013.01); *H01L 29/66833* (2013.01); *H01L 29/792* (2013.01); *H10B 43/10* (2023.02); *H01L 29/66825* (2013.01); *H01L 29/788* (2013.01); *H10B 41/10* (2023.02); *H10B 41/35* (2023.02)

(58) Field of Classification Search
CPC ..................................................... H10B 43/35
See application file for complete search history.

(56) References Cited

U.S. PATENT DOCUMENTS

| | | | |
|---|---|---|---|
| 8,400,812 B2 | 3/2013 | Kutsukake et al. | |
| 2001/0018253 A1* | 8/2001 | Nakamura | H10B 41/30 438/296 |
| 2002/0041526 A1* | 4/2002 | Sugita | H10B 43/30 257/E21.679 |

(Continued)

FOREIGN PATENT DOCUMENTS

| | | | | |
|---|---|---|---|---|
| EP | 1170800 A2 * | 1/2002 | ......... | G11C 16/0475 |
| JP | 2012-199292 A | 10/2012 | | |

*Primary Examiner* — Peter Bradford
(74) *Attorney, Agent, or Firm* — Oblon, McClelland, Maier & Neustadt, L.L.P.

(57) ABSTRACT

A semiconductor device includes: a semiconductor substrate; a transistor formed on the semiconductor substrate; a first insulating layer adjacent to the transistor in a first direction along a main surface of the semiconductor substrate, the first insulating layer being formed toward an inside of the semiconductor substrate; a first conductive layer connected to a gate of the transistor, a part of the first conductive layer being opposed to the first insulating layer; a second insulating layer disposed between the first insulating layer and the first conductive layer; and a first semiconductor layer disposed between the second insulating layer and the first conductive layer.

10 Claims, 12 Drawing Sheets

(56) References Cited

U.S. PATENT DOCUMENTS

| | | | |
|---|---|---|---|
| 2002/0195645 A1* | 12/2002 | Takada | H10B 41/30 |
| | | | 257/314 |
| 2007/0290253 A1* | 12/2007 | Kito | H01L 29/42336 |
| | | | 257/E29.302 |
| 2012/0236619 A1* | 9/2012 | Kutsukake | H10B 41/41 |
| | | | 365/72 |
| 2017/0358593 A1* | 12/2017 | Yu | H10B 43/27 |

* cited by examiner

MEMORY DEVICE WITH SEMICONDUCTOR LAYER ON ISOLATION STRUCTURE

CROSS-REFERENCE TO RELATED APPLICATIONS

This application is based upon and claims the benefit of Japanese Patent Application No. 2021-044592, filed on Mar. 18, 2021, the entire contents of which are incorporated herein by reference.

BACKGROUND

Field

Embodiments described herein relate generally to a semiconductor device and a method of manufacturing the same.

Description of the Related Art

There has been known a semiconductor device comprising a semiconductor substrate and a plurality of transistors formed on the semiconductor substrate.

DETAILED DESCRIPTION

A semiconductor device according to one embodiment comprises: a semiconductor substrate; a transistor formed on the semiconductor substrate; a first insulating layer adjacent to the transistor in a first direction along a main surface of the semiconductor substrate, the first insulating layer being formed toward an inside of the semiconductor substrate; a first conductive layer connected to a gate of the transistor, a part of the first conductive layer being opposed to the first insulating layer; a second insulating layer disposed between the first insulating layer and the first conductive layer; and a first semiconductor layer disposed between the second insulating layer and the first conductive layer.

Next, the semiconductor devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, a direction parallel to a main surface of the substrate is referred to as an X-direction, a direction parallel to the surface of the substrate and perpendicular to the X-direction is referred to as a Y-direction, and a direction perpendicular to the surface of the substrate is referred to as a Z-direction. Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration.

In this specification, a "semiconductor device" includes various kinds of meanings, such as a memory system including a control die, such as a memory die, a memory chip, a memory card, and an SSD, and a configuration including a host computer, such as a smartphone, a tablet terminal, and a personal computer, or a configuration main purpose of which is not to store data, such as a sensor, and an arithmetic device.

In this specification, a first configuration being "electrically connected" to a second configuration refers that the first configuration is connected to the second configuration directly or via a circuit, such as a wiring, a semiconductor member, or a transistor. For example, when three transistors are connected in series, even when the 2nd transistor is in a state of OFF, the 1st transistor is "electrically connected" to the 3rd transistor.

First Embodiment

[Configuration]

The configuration of the semiconductor device according to the first embodiment is described with reference to the drawings.

Figure 1:
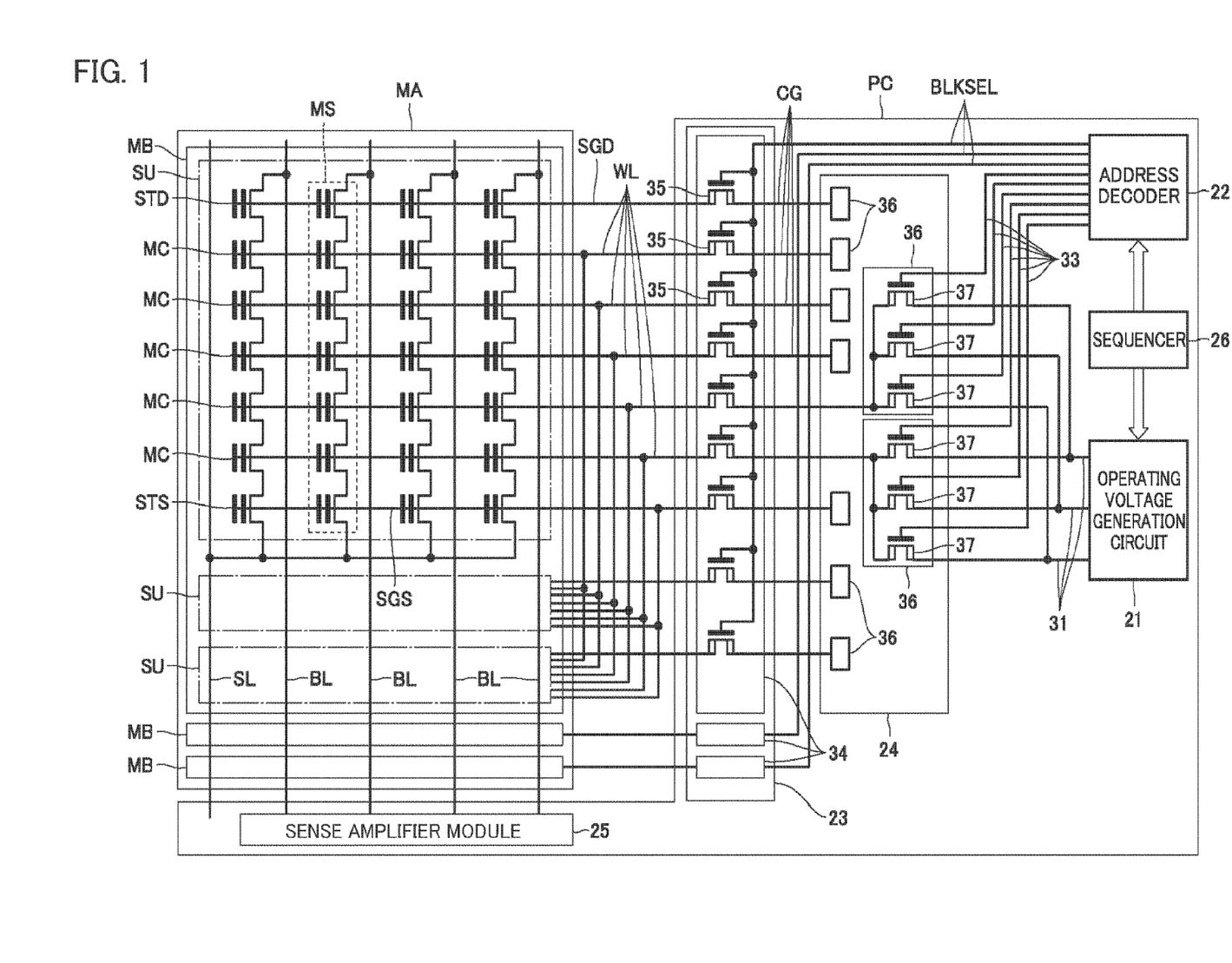
FIG. 1 is an equivalent circuit diagram illustrating a schematic configuration of a semiconductor device according to a first embodiment.

FIG. 1 is a schematic equivalent circuit diagram illustrating the configuration of the semiconductor device according to the first embodiment applied to a semiconductor memory device.

The semiconductor device according to the embodiment includes a memory cell array MA and a peripheral circuit PC as a control circuit that controls the memory cell array MA.

The memory cell array MA includes a plurality of memory blocks MB. Each of the plurality of memory blocks MB includes a plurality of string units SU. Each of the plurality of string units SU includes a plurality of memory strings MS. The plurality of memory strings MS have one ends each connected to the peripheral circuit PC via a bit lines BL. The plurality of memory strings MS have other ends each connected to the peripheral circuit PC via a common source line SL.

The memory string MS includes a drain select transistor STD, a plurality of memory cells MC, and a source select transistor STS, which are connected in series between the bit line BL and the source line SL. Hereinafter, the drain select transistor STD and the source select transistor STS may be simply referred to as select transistors (STD, STS) or the like.

The memory cell MC is a field-effect type transistor (memory transistor) including a semiconductor layer that functions as a channel region, a gate insulating film including an electric charge accumulating film, and a gate electrode. The memory cell MC has a threshold voltage that changes corresponding to an electric charge amount in the electric charge accumulating film. The gate electrodes of the plurality of memory cells MC corresponding to one memory string MS are connected to respective word lines WL. The respective word lines WL are connected to all the memory strings MS in one memory block MB in common.

The select transistors (STD, STS) are field-effect type transistors each including a semiconductor layer that functions as a channel region, a gate insulating film, and a gate electrode. The gate electrodes of the select transistors (STD, STS) are connected to respective select gate lines (SGD, SGS). The drain select gate line SGD is disposed corresponding to the string unit SU and connected to all the memory strings MS in one string unit SU in common. The source select gate line SGS is connected to all the memory strings MS in the plurality of string units SU in one memory block MB in common.

The peripheral circuit PC includes an operating voltage generation circuit 21 that generates operating voltages, an address decoder 22 that decodes address data, a block select circuit 23 and a voltage select circuit 24 that transfers the operating voltage to the memory cell array MA corresponding to an output signal of the address decoder 22, a sense amplifier module 25 connected to the bit lines BL, and a sequencer 26 that controls them.

The operating voltage generation circuit 21 includes a plurality of operating voltage output terminals 31. The operating voltage generation circuit 21 includes, for example, a step-down circuit, such as a regulator, and a step-up circuit, such as a charge pump circuit. The operating voltage generation circuit 21 sequentially generates a plurality of operating voltages applied to the bit line BL, the source line SL, the word line WL, and the select gate lines (SGD, SGS) in a read operation, a write operation, and an erase operation on the memory cell array MA, in accordance with a control signal from the sequencer 26 to output the operating voltages to the plurality of operating voltage output terminals 31. The operating voltages output from the operating voltage output terminals 31 are appropriately adjusted in accordance with the control signal from the sequencer 26.

The address decoder 22 includes a plurality of block select lines BLKSEL and a plurality of voltage select lines 33.

For example, the address decoder 22 sequentially refers to address data in an address register in accordance with the control signal from the sequencer 26, decodes this address data to cause a block driving transistor 35 and a voltage select transistor 37 corresponding to the address data to be in a state of ON, and causes the block driving transistors 35 and the voltage select transistors 37 other than those to be in a state of OFF. For example, voltages of the block select line BLKSEL and the voltage select line 33 corresponding to the address data are set to be in a state of "H" and voltages other than those are set to be in a state of "L". When a P channel type transistor is used, not an N channel type transistor, an inverse voltage is applied to these wirings.

In the illustrated example, in the address decoder 22, one block select line BLKSEL is disposed for every memory block MB. However, this configuration is appropriately changeable. For example, one block select line BLKSEL may be provided for every two or more memory blocks MB.

The block select circuit 23 includes a plurality of block selectors 34 corresponding to the memory block MB. Each of the plurality of block selectors 34 includes a plurality of block driving transistors 35 corresponding to the word lines WL and the select gate lines (SGD, SGS). The block driving transistor 35 is, for example, a field-effect type high voltage transistor. The block driving transistors 35 have drain electrodes each electrically connected to the corresponding word line WL or select gate line (SGD, SGS). Each of source electrodes is electrically connected to the operating voltage output terminal 31 via a wiring CG and the voltage select circuit 24. Gate electrodes are connected to the corresponding block select line BLKSEL in common.

Note that the block select circuit 23 further includes a plurality of transistors (not illustrated). The plurality of transistors are field-effect type high voltage transistors connected between the select gate lines (SGD, SGS) and ground voltage supply terminals. The plurality of transistors electrically conduct the select gate lines (SGD, SGS) included in unselected memory blocks MB to the ground voltage supply terminals. Note that the plurality of word lines WL included in the unselected memory blocks MB enter a floating state.

The voltage select circuit 24 includes a plurality of voltage selectors 36 corresponding to the word lines WL and the select gate lines (SGD, SGS). Each of the plurality of voltage selectors 36 includes a plurality of voltage select transistors 37. The voltage select transistor 37 is, for example, a field-effect type high voltage transistor. The voltage select transistors 37 have drain terminals each electrically connected to the corresponding word line WL or select gate line (SGD, SGS) via the wiring CG and the block select circuit 23. Each of source terminals is electrically connected to the corresponding operating voltage output terminal 31. Each of gate electrodes is connected to the corresponding voltage select line 33.

The sense amplifier module 25 is connected to the plurality of bit lines BL. The sense amplifier module 25 includes, for example, a plurality of sense amplifier units corresponding to the bit lines BL. Each of the sense amplifier units includes a clamp transistor that charges the bit line BL based on the voltage generated in the operating voltage generation circuit 21, a sense transistor that senses the voltage or a current of the bit line BL, a plurality of latch circuits that latch output signals, write data, and the like of this sense transistor.

The sequencer 26 outputs the control signal to the operating voltage generation circuit 21, the address decoder 22, and the sense amplifier module 25 according to an input instruction and a state of the semiconductor device. For example, the sequencer 26 sequentially refers to command data in a command register in accordance with a clock signal, decodes this command data, and outputs it to the operating voltage generation circuit 21, the address decoder 22, and the sense amplifier module 25.

Figure 2:
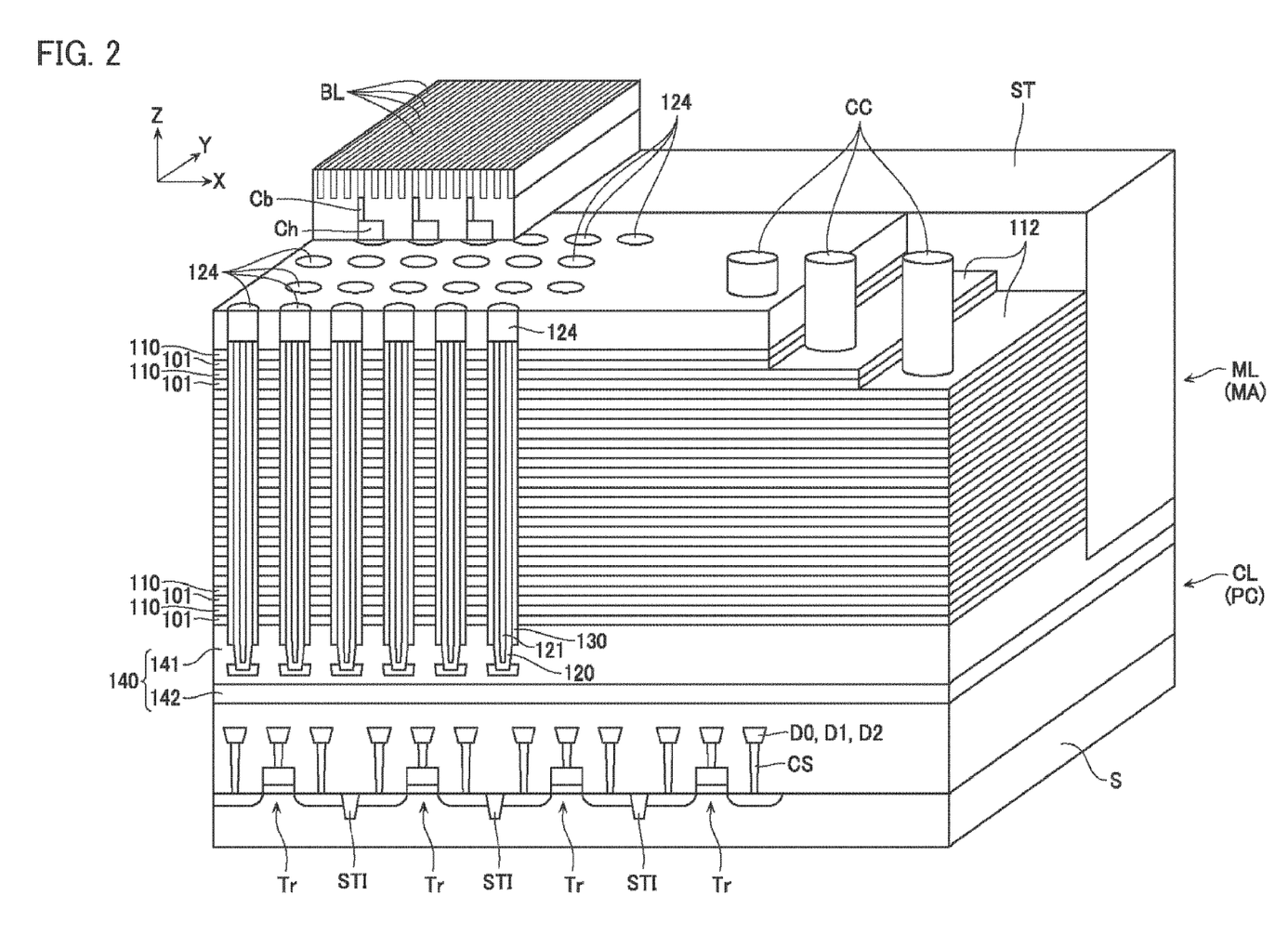
FIG. 2 is a schematic perspective view of the semiconductor device.

FIG. 2 is a schematic perspective view of the semiconductor device according to the embodiment. FIG. 2 illustrates a schematic structure for description and does not illustrate a detail arrangement of each configuration, or the like.

As illustrated in FIG. 2, the semiconductor device according to the embodiment includes a semiconductor substrate S, a circuit layer CL disposed on the semiconductor substrate S, and a memory layer ML disposed above the circuit layer CL.

The semiconductor substrate S is, for example, a semiconductor substrate made of single-crystal silicon (Si) or the like. The semiconductor substrate S includes, for example, a double well structure that has an N-type well on a surface of a P type semiconductor substrate and further has a P-type well in the N-type well. Insulating layers STI of silicon oxide ($SiO_2$) or the like are disposed in the semiconductor substrate S.

The circuit layer CL includes a plurality of transistors Tr that constitute the peripheral circuit PC (FIG. 1), a plurality of wirings D0, D1, and D2 and a plurality of contacts CS connected to the plurality of transistors Tr. The transistor Tr is, for example, a field-effect type transistor that uses a surface of the semiconductor substrate S as a channel region. In the surface of the semiconductor substrate S, regions that function as parts of the transistors Tr are surrounded by the insulating layers STI.

The memory layer ML includes a plurality of configurations included in the memory cell array MA. The memory layer ML includes a plurality of conductive layers 110 arranged in the Z-direction, a semiconductor column 120 that extends in the Z-direction and is opposed to the plurality of conductive layers 110, a gate insulating film 130 disposed between the plurality of conductive layers 110 and the semiconductor column 120, and a conductive layer 140 connected to a lower end of the semiconductor column 120.

The conductive layer 110 is an approximately plate-shaped conductive layer extending in the X-direction. The plurality of conductive layers 110 are arranged in the Z-direction. For example, the conductive layer 110 may include a stacked film of titanium nitride (TiN) and tungsten (W), or the like, or may include polycrystalline silicon containing impurities, such as phosphorus or boron, or the like. An insulating layer 101 of silicon oxide ($SiO_2$) or the like is disposed between the conductive layers 110.

Among the plurality of conductive layers 110, one or more conductive layers 110 positioned at the lowermost layer function as the source select gate line SGS (FIG. 1) and gate electrodes of the plurality of source select transistors STS (FIG. 1) connected to the source select gate line SGS. The plurality of conductive layers 110 positioned above this layer function as the word lines WL (FIG. 1) and gate electrodes of the plurality of memory cells MC (FIG. 1) connected to the word lines WL. One or more conductive layers 110 positioned above these conductive layers 110 function as the drain select gate line SGD (FIG. 1) and gate electrodes of the plurality of drain select transistors STD (FIG. 1) connected to the drain select gate line SGD.

The plurality of semiconductor columns 120 are provided in the X-direction and the Y-direction. The semiconductor column 120 is, for example, a semiconductor layer of non-doped polycrystalline silicon (Si) or the like. The semiconductor column 120 has an approximately cylindrical shape and includes an insulating layer 121 of silicon oxide or the like at a center part. Each of the semiconductor columns 120 has an outer peripheral surface surrounded by the conductive layers 110. The semiconductor column 120 has a lower end portion connected to the conductive layer 140. The semiconductor column 120 has an upper end portion connected to the bit line BL extending in the Y-direction via a semiconductor layer 124 containing N-type impurity, such as phosphorus (P), and contacts Ch and Cb. Each of the semiconductor columns 120 functions as channel regions of the plurality of memory cells MC and the select transistors (STD, STS) included in one memory string MS (FIG. 1).

Figure 3:
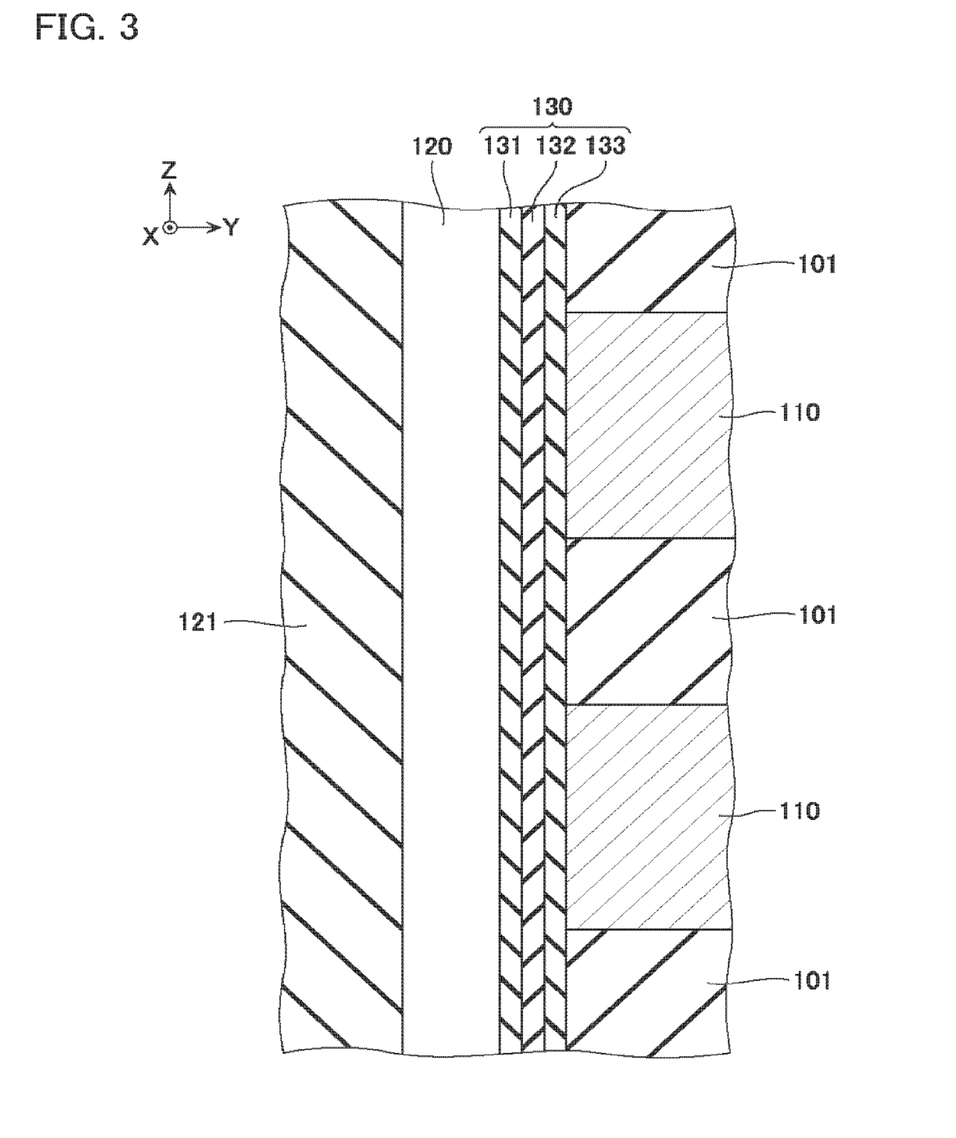
FIG. 3 is a schematic enlarged view of FIG. 2.

The gate insulating film 130 includes, for example, as illustrated in FIG. 3, a tunnel insulating film 131, an electric charge accumulating film 132, and a block insulating film 133, which are stacked between the semiconductor column 120 and the conductive layers 110. The tunnel insulating film 131 and the block insulating film 133 are, for example, insulating films of silicon oxide or the like. The electric charge accumulating film 132 is, for example, a film capable of accumulating electric charge of silicon nitride (SiN) or the like. The tunnel insulating film 131, the electric charge accumulating film 132, and the block insulating film 133, which have approximately cylindrical shapes, extend in the Z-direction along the outer peripheral surface of the semiconductor column 120.

FIG. 3 illustrates an example in which the gate insulating film 130 includes the electric charge accumulating film 132 of silicon nitride or the like. However, the gate insulating film 130 may include, for example, a floating gate of polycrystalline silicon or the like containing N-type or P-type impurities.

For example, as illustrated in FIG. 2, the conductive layer 140 includes a conductive film 141 connected to the lower end portions of the semiconductor columns 120 and a conductive film 142 disposed on the lower surface of the conductive film 141. The conductive film 141 includes, for example, a conductive semiconductor, such as polysilicon containing N-type impurity, such as phosphorus (P). The conductive film 142 may include, for example, a conductive semiconductor, such as polysilicon, containing N-type impurity, such as phosphorus (P), may include a metal, such as tungsten (W), or may include silicide or the like.

Figure 4:
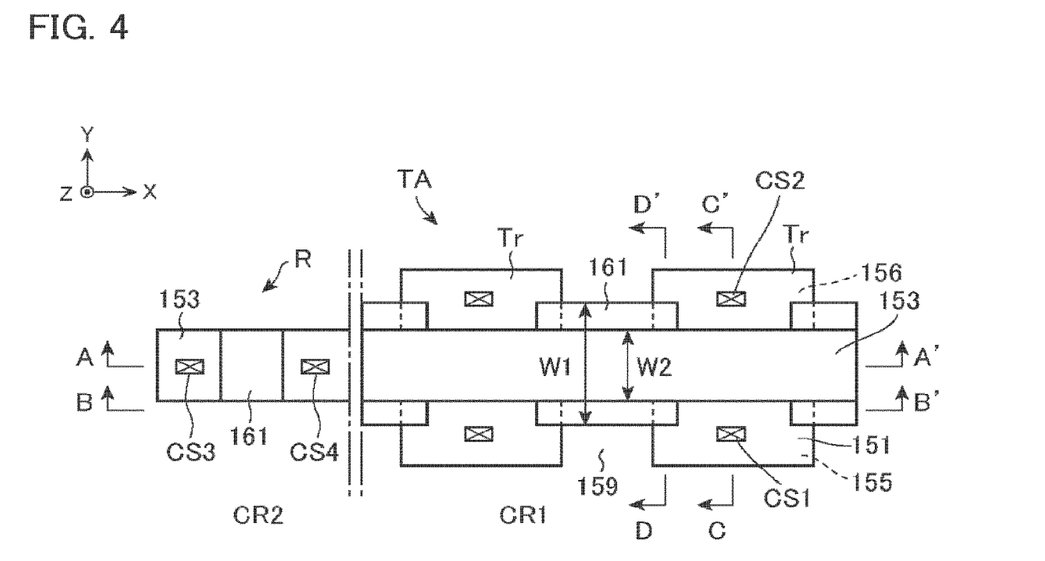
FIG. 4 is a schematic plan view of a circuit layer of the semiconductor device.

Next, the circuit layer CL of the semiconductor device according to the embodiment is described with reference to FIG. 4 to FIG. 8. FIG. 4 is a schematic plan view illustrating a part of the circuit layer CL positioned at the lower layer of the memory layer ML in FIG. 2. FIGS. 5, 6, 7, and 8 are schematic cross-sectional views of the structure illustrated in FIG. 4 taken along the lines A-A', B-B', C-C', and D-D' and viewed in the arrow directions, respectively.

The circuit layer CL includes a first circuit region CR1 and a second circuit region CR2, which are disposed in the X-direction. The first circuit region CR1 includes a transistor array TA in which the plurality of transistors Tr are arranged. The second circuit region CR2 includes circuits that include passive elements, such as a resistor element R.

Figure 7:
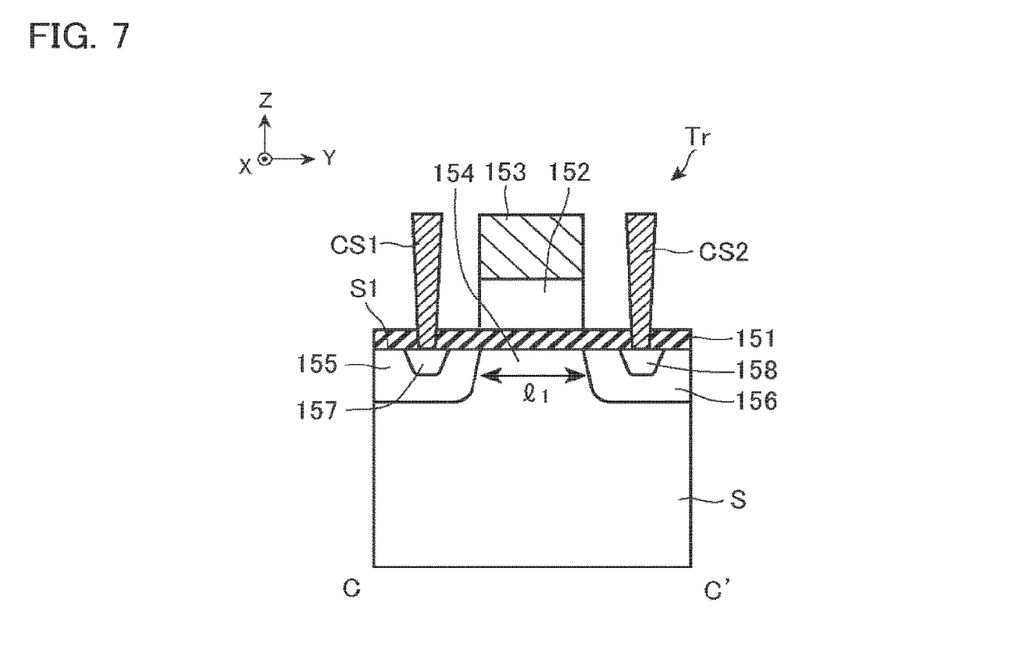
FIG. 7 is a schematic cross-sectional view of the structure illustrated in FIG. 4 taken along the line C-C' and viewed in an arrow direction.

The plurality of transistors Tr are, for example, arranged in the X-direction and the Y-direction. The plurality of transistors Tr function as, for example, a high voltage transistor, such as the block driving transistor 35 illustrated in FIG. 1. Each transistor Tr, as illustrated in FIG. 7, includes an insulating layer 151 formed on a main surface S1 of the semiconductor substrate S, a semiconductor layer 152 formed on the insulating layer 151, and a conductive layer 153 formed on the semiconductor layer 152. The insulating layer 151 includes, for example, silicon oxide ($SiO_2$) and constitutes agate insulating layer of the transistor Tr. The semiconductor layer 152 includes a conductive semiconductor, such as polysilicon. The conductive layer 153 is, for example, a metal wiring of tungsten (W) or the like. The semiconductor layer 152 and the conductive layer 153 constitute a gate electrode of the transistor Tr.

The semiconductor substrate S immediately below the semiconductor layer 152 is a channel region 154 of the transistor Tr. The channel region 154 of the semiconductor substrate S has both sides in the Y-direction on which respective impurity layers 155 and 156 are formed. The semiconductor substrate S (or the well) includes, for example, the P-type impurity, such as boron (B). The impurity layers 155 and 156 include, for example, N-type impurities, such as phosphorus (P). The impurity layer 155 constitutes, for example, a source of the transistor Tr. The impurity layer 156 constitutes, for example, a drain of the transistor Tr. In the impurity layers 155 and 156 near the main surface S1, for example, respective N-type high concentration impurity layers 157 and 158 are formed. A contact CS1 for the source is connected to the high concentration impurity layer 157, and a contact CS2 for the drain is connected to the high concentration impurity layer 158.

Figure 5:
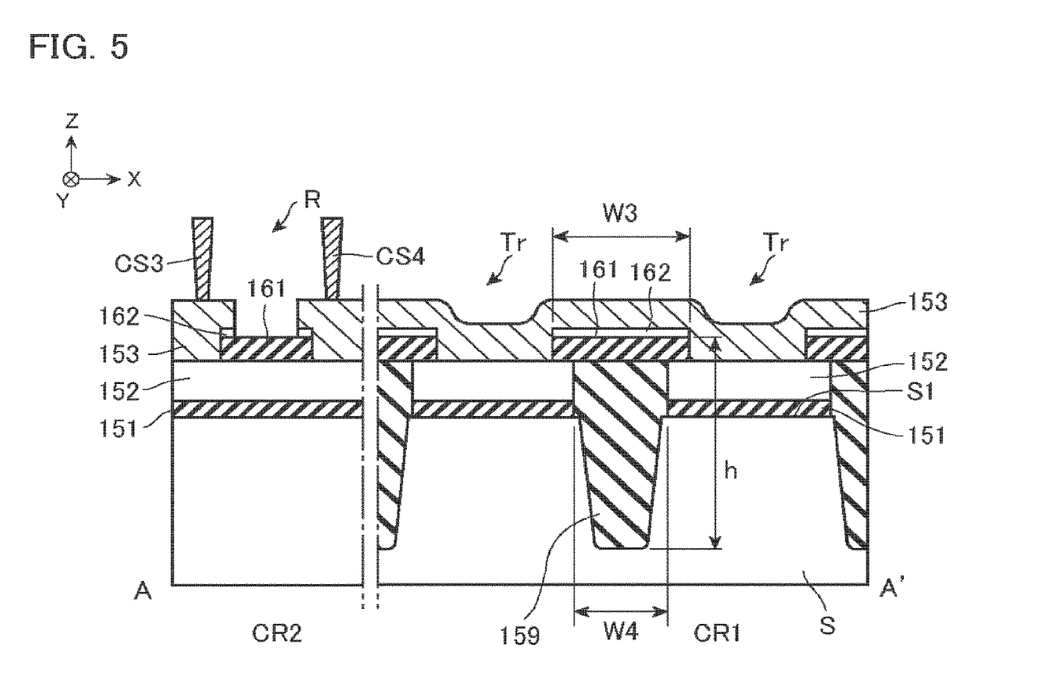
FIG. 5 is a schematic cross-sectional view of a structure illustrated in FIG. 4 taken along the line A-A' and viewed in an arrow direction.
Figure 6:
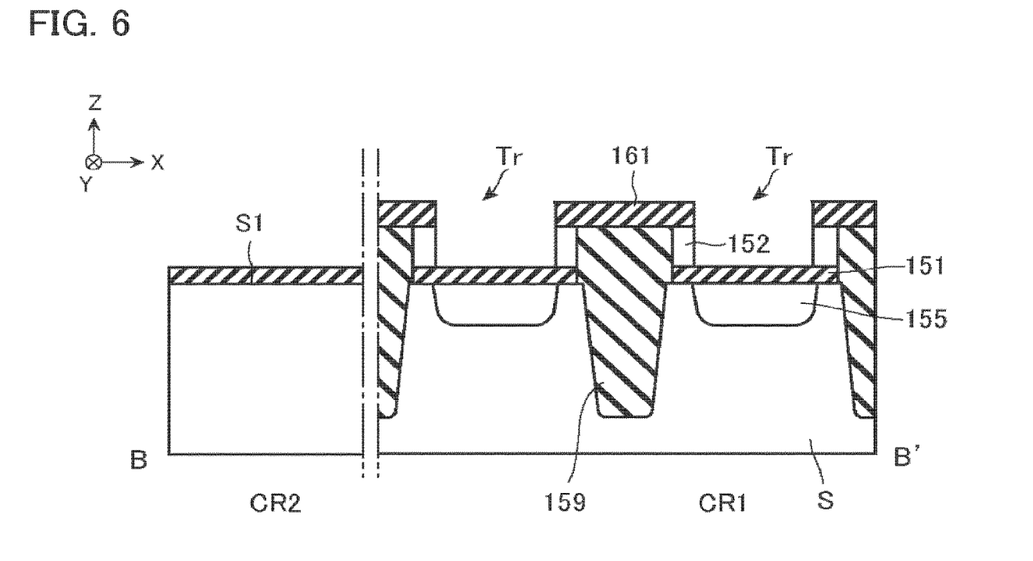
FIG. 6 is a schematic cross-sectional view of the structure illustrated in FIG. 4 taken along the line B-B' and viewed in an arrow direction.

As illustrated in FIGS. 5 and 6, an insulating layer 159 constituting a Shallow Trench Isolation (STI) for inter-element isolation is disposed between the transistors Tr adjacent in the X-direction and the Y-direction. The insulating layer 159 has an upper surface that approximately matches an upper surface of the semiconductor layer 152 and has a lower surface that extends toward an inside of the semiconductor substrate S. The insulating layer 159 extends in the X-direction and the Y-direction so as to surround the transistor Tr.

Figure 9:
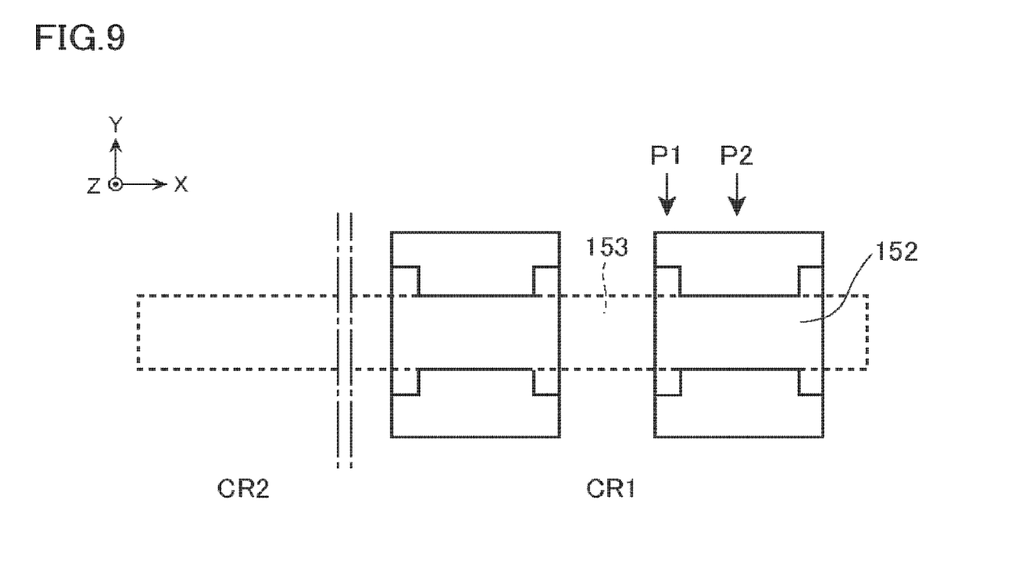
FIG. 9 is a schematic plan view illustrating an extracted part of the structure illustrated in FIG. 4.

The conductive layer 153 extends in the X-direction across the plurality of transistors Tr arranged in the X-direction and is connected to these transistors Tr as the gate electrode in common. As illustrated in FIG. 4, an insulating layer 161 having a rectangular planar shape is disposed between the conductive layer 153 and the insulating layer 159. A semiconductor layer 162 is disposed between the conductive layer 153 and the insulating layer 161. As illustrated in FIG. 4, a width w1 in the Y-direction of the insulating layer 161 is greater than a width w2 in the Y-direction of the conductive layer 153. As illustrated in FIG. 5, a width w3 in the X-direction of the insulating layer 161 is greater than a maximum width w4 in the X-direction of the insulating layer 159. A width in the Y-direction of the semiconductor layer 152 is approximately equal to the width w1 of the insulating layer 161 immediately under the insulating layer 161 and is approximately equal to the width w2 of the conductive layer 153 immediately under the conductive layer 153. The semiconductor layer 152 is separated in the X-direction by the insulating layer 159. Consequently, as illustrated in FIG. 9, the semiconductor layer 152 is formed in a hammerhead type (H type) in a planar shape when viewed from the Z-direction. Namely, in the semiconductor layer 152, the width in the Y-direction at a first position P1 adjacent to the insulating layer 159 is greater than the width in the Y-direction at a second position P2 farther from the insulating layer 159 than the first position P1.

Figure 8:
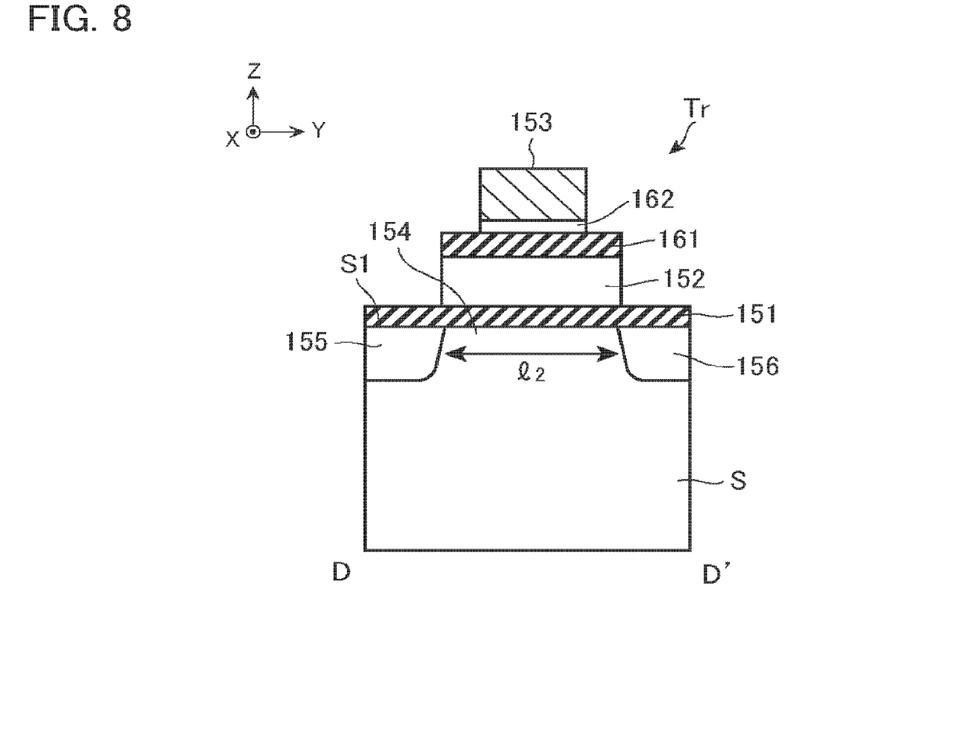
FIG. 8 is a schematic cross-sectional view of the structure illustrated in FIG. 4 taken along the line D-D' and viewed in an arrow direction.

The hammerhead type planar shape of the semiconductor layer 152 corresponds to a planar shapes of the impurity layers 155 and 156 of the semiconductor substrate S. Namely, as illustrated in FIGS. 7 and 8, a channel length l2 of the transistor Tr near the insulating layer 159, where the width in the Y-direction of the semiconductor layer 152 is W1, is longer than a channel length l1 of the transistor Tr at a center portion in the X-direction, where the width in the Y-direction of the semiconductor layer 152 is W2.

As illustrated in FIG. 5, also in the second circuit region CR2, by the same manufacturing process as the first circuit region CR1, a circuit that includes the passive element, such as the resistor element R having a similar stacked structure, is formed. In the second circuit region CR2, the resistor element R uses the semiconductor layer 152 as a resistor. The insulating layer 161 having the rectangular planar shape is disposed on the semiconductor layer 152. The semiconductor layer 162 and the conductive layer 153 are disposed on both ends in the X-direction of the insulating layer 161. Each of the conductive layer 153 and the semiconductor layer 162 has parts separated in the X-direction on the insulating layer 161. The separated parts of the conductive layer 153 are connected to the semiconductor layer 152 on both sides in the X-direction of the insulating layer 161. Respective contacts CS3 and CS4 are connected to the separated parts of the conductive layers 153 on both sides in the X-direction of the insulating layer 161.

Effect of First Embodiment

Figure 10:
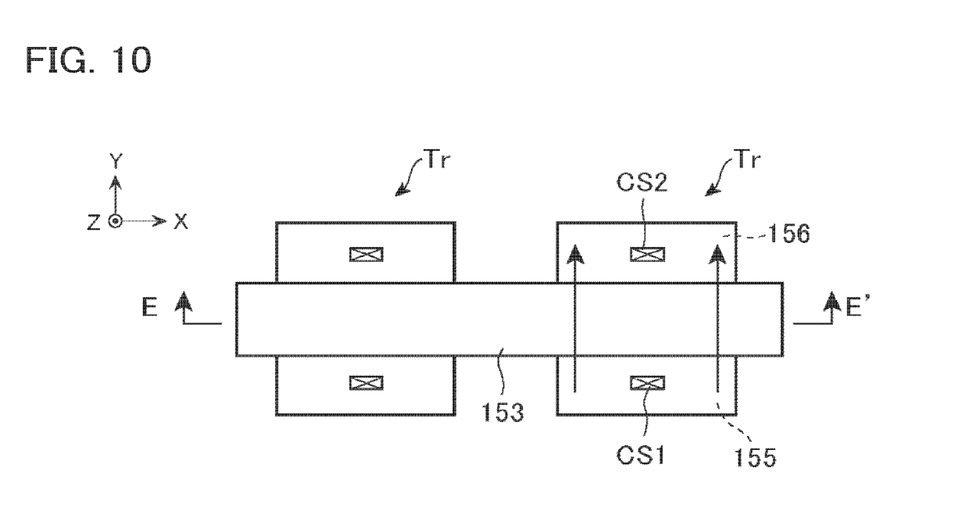
FIG. 10 is a schematic plan view of a circuit layer of a semiconductor device according to a comparative example.
Figure 11:
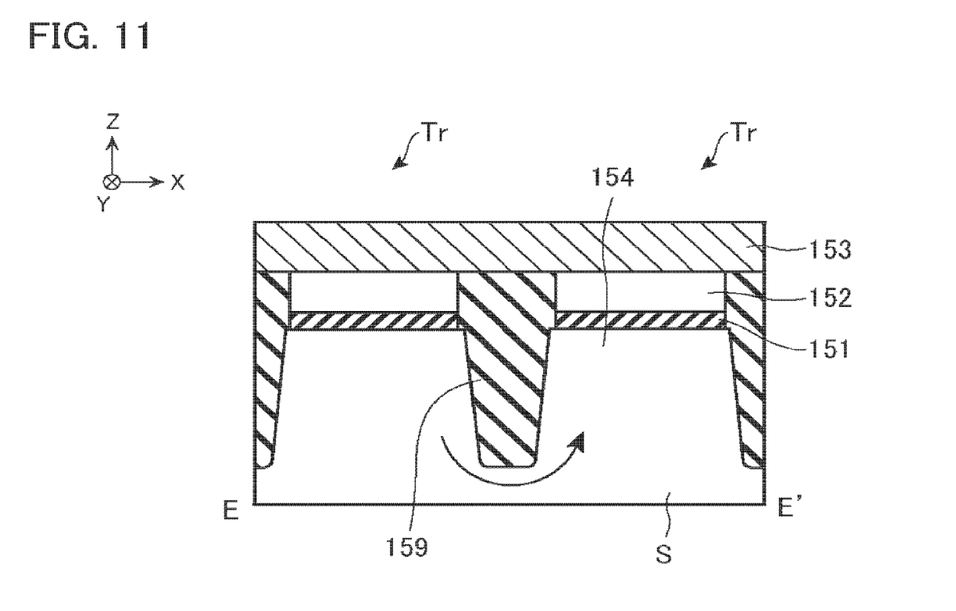
FIG. 11 is a schematic cross-sectional view of the structure illustrated in FIG. 9 taken along the line E-E' and viewed in an arrow direction.

FIG. 10 is a schematic plan view of a semiconductor device according to a comparative example. FIG. 11 is a schematic cross-sectional view of the structure illustrated in FIG. 10 taken along the line E-E' and viewed in an arrow direction. The semiconductor device according to the comparative example does not have the insulating layer 161 or the semiconductor layer 162 between the insulating layer 159 and the conductive layer 153. In the semiconductor device according to the comparative example, the planar shape of the semiconductor layer 152 matches that of the conductive layer 153.

With such semiconductor device according to the comparative example, in a heat treatment process or the like during manufacturing, boron (B) as the impurity is sometimes absorbed in the insulating layer 159 side in a neighborhood region (hereinafter referred to as "edge region") of the insulating layer 159 in the channel region 154 of the transistor Tr. As a result, as illustrated in FIG. 10, there is a problem that a threshold voltage is decreased in the edge region, and a leakage current occurs.

As illustrated in FIG. 11, with the semiconductor device according to the comparative example, a field transistor is formed by the channel formed on a lower side of the insulating layer 159 between the transistors Tr adjacent in the X-direction, and the leakage current sometimes occurs also between the adjacent transistors Tr.

These problems make it difficult to decrease an element-to-element pitch and lead to an increase in ratio of a transistor area to a chip area. In particular, the tendency is remarkable in a high withstand voltage transistor, such as a memory block select transistor in a semiconductor memory device.

In contrast, with the first embodiment, as illustrated in FIGS. 7 and 8, the channel length 12 of the transistor Tr in the edge region is longer than the channel length 11 of the transistor Tr in a region farther from the insulating layer 159 than the edge region. In view of this, a decrease in the threshold voltage in the edge region is canceled by the increase in the channel length, and, as a result, occurrence of the leakage current can be reduced.

Furthermore, with the first embodiment, as illustrated in FIG. 5, the insulating layer 161 is disposed on the insulating layer 159. In view of this, a height h of the insulating layer is higher than that of the comparative example, and the field transistor is less likely to be turned ON by that amount, and thus, the leakage current between the adjacent transistors Tr can be reduced.

[Manufacturing Method]

Next, with reference to FIG. 12 to FIG. 21, the manufacturing method of the semiconductor device according to the first embodiment is described. FIG. 12 to FIG. 15, FIG. 17, FIG. 19, and FIG. 20 are cross-sectional views of the corresponding plan views taken along the lines A-A' and B-B' and viewed in the arrow directions.

Figure 12:
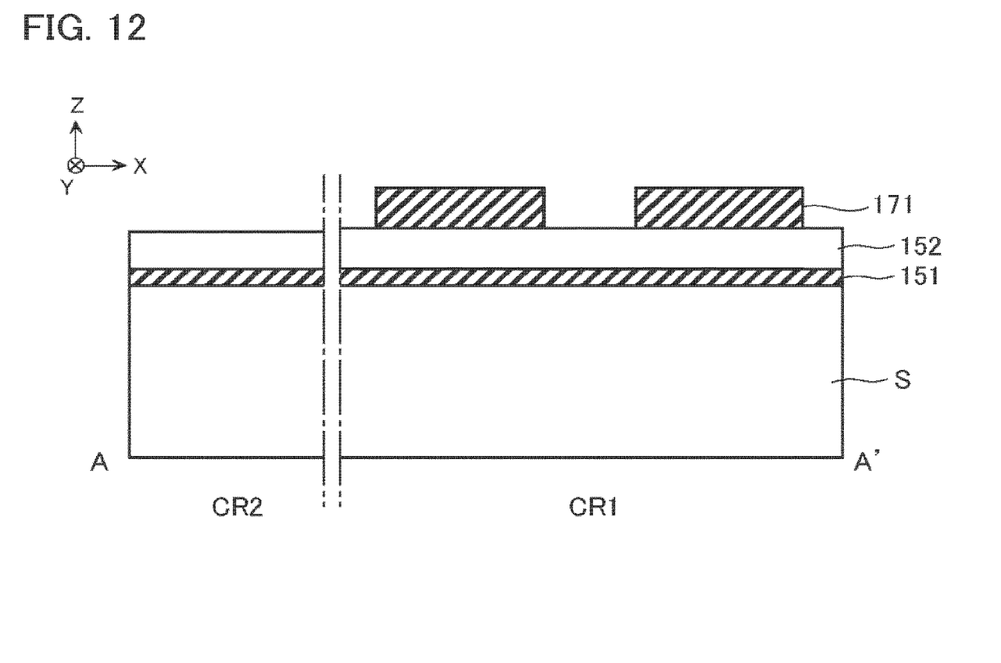
FIG. 12 is a schematic cross-sectional view illustrating a method of manufacturing the semiconductor device illustrated in FIG. 4.

First, as illustrated in FIG. 12, the insulating layer 151, the semiconductor layer 152, and a mask material 171 are sequentially formed on the P-type semiconductor substrate S. The insulating layer 151 is formed by, for example, thermal oxidation, and the semiconductor layer 152 and the mask material 171 are formed by, for example, a method such as Chemical Vapor Deposition (CVD).

Figure 13:
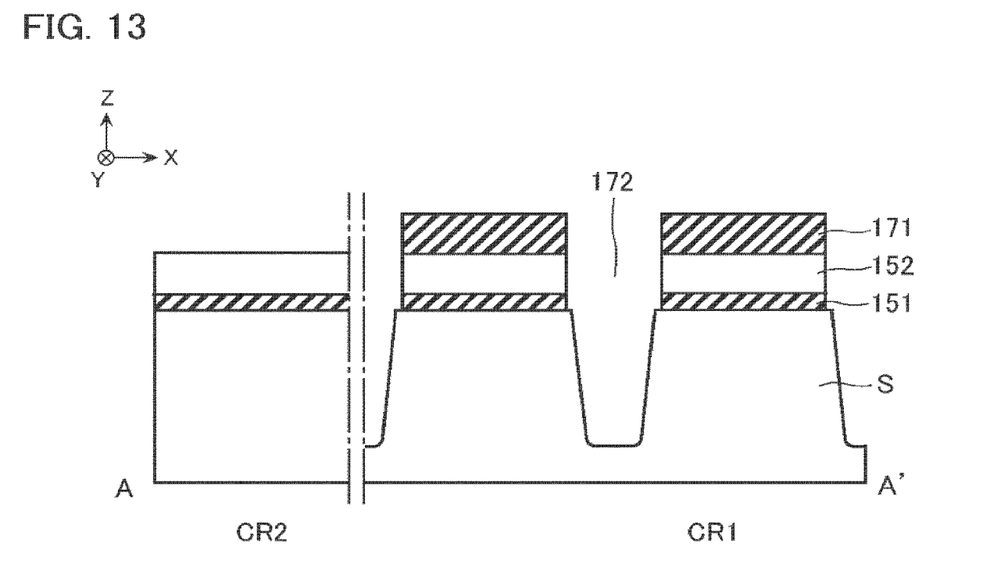
FIG. 13 is a schematic cross-sectional view illustrating the manufacturing method of the semiconductor device.

Next, as illustrated in FIG. 13, by using the mask material 171 as a mask, a trench 172 is formed by, for example, a method such as Reactive Ion Etching (RIE).

Figure 14:
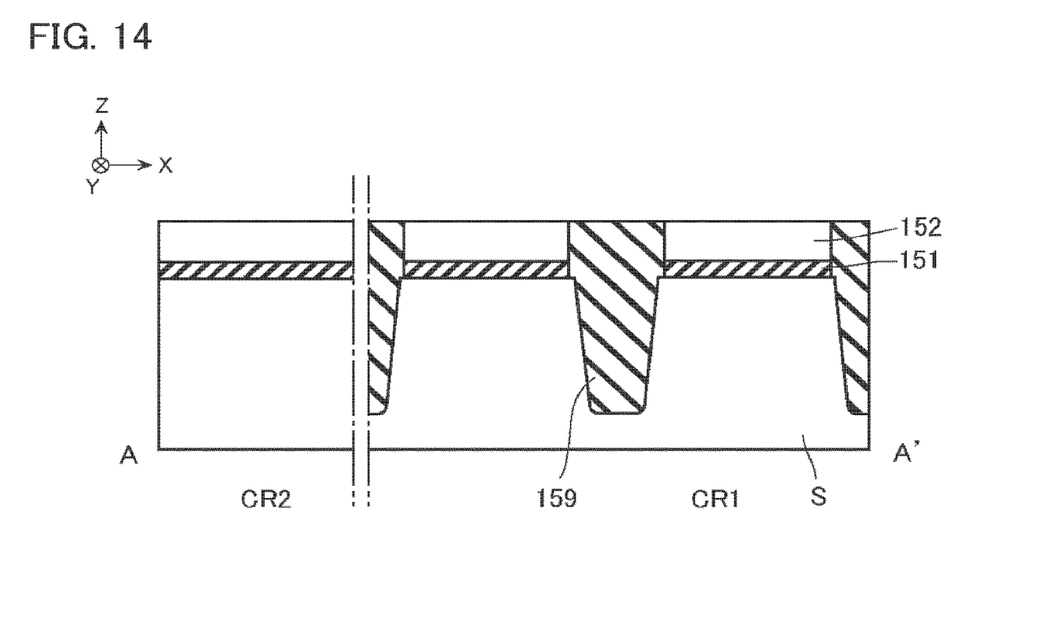
FIG. 14 is a schematic cross-sectional view illustrating the manufacturing method of the semiconductor device.

Next, as illustrated in FIG. 14, the insulating layer 159 is embedded into the trench 172 by, for example, a method such as CVD. Then, after a heat treatment, an upper surface of a stacked body is flattened up to the upper surface of the semiconductor layer 152 by, for example, a method such as Chemical Mechanical Polishing (CMP).

Figure 15:
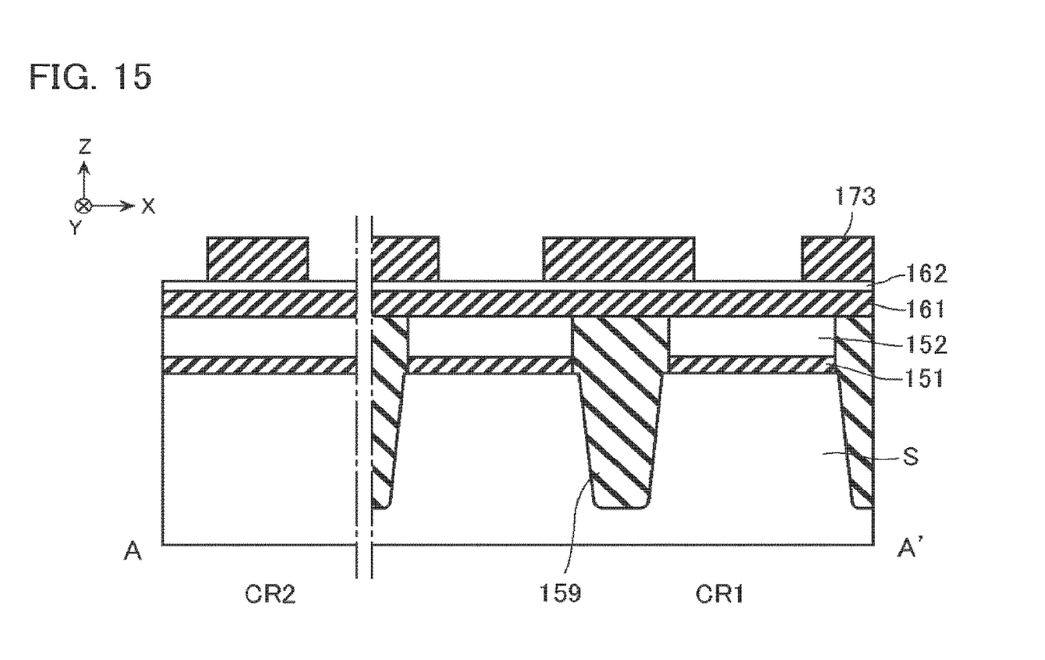
FIG. 15 is a schematic cross-sectional view illustrating the manufacturing method of the semiconductor device.

Next, as illustrated in FIG. 15, the insulating layer 161, the semiconductor layer 162, and a mask material 173 are sequentially formed on the semiconductor layer 152 and the insulating layer 159 by, for example, a method such as CVD.

Figure 16:
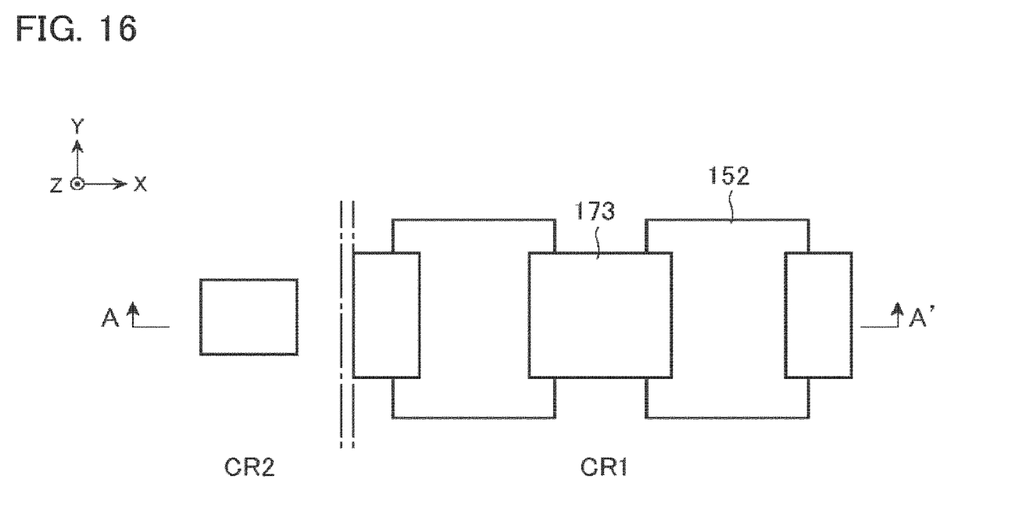
FIG. 16 is a schematic plan view illustrating the manufacturing method of the semiconductor device.
Figure 17:
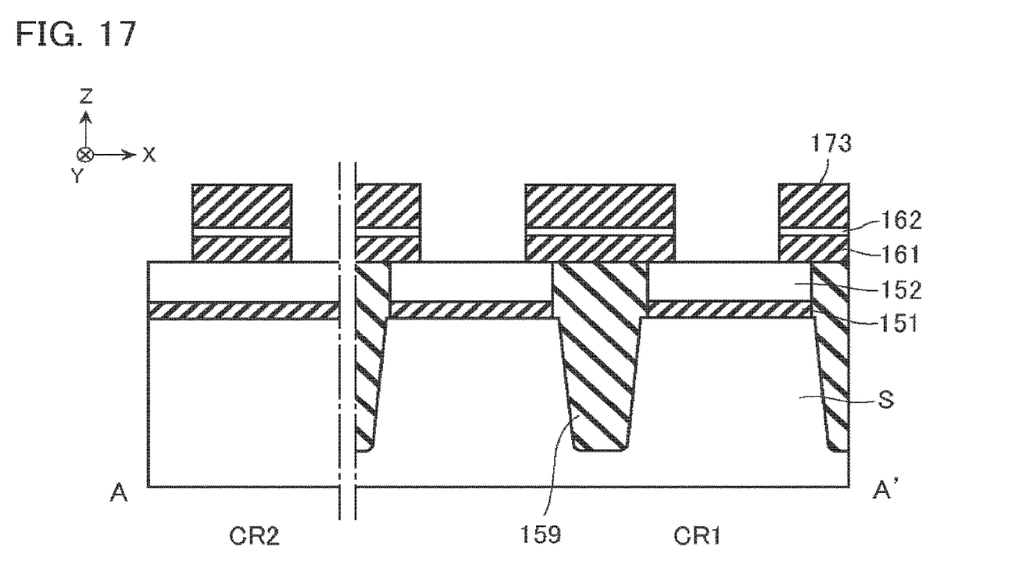
FIG. 17 is a schematic cross-sectional view illustrating the manufacturing method of the semiconductor device.

Next, as illustrated in FIGS. 16 and 17, by using the mask material 173 as a mask, the insulating layer 161 and the semiconductor layer 162 are selectively etched such that the insulating layer 161 and the semiconductor layer 162 have rectangular planar shapes by, for example, a method such as RIE.

Figure 18:
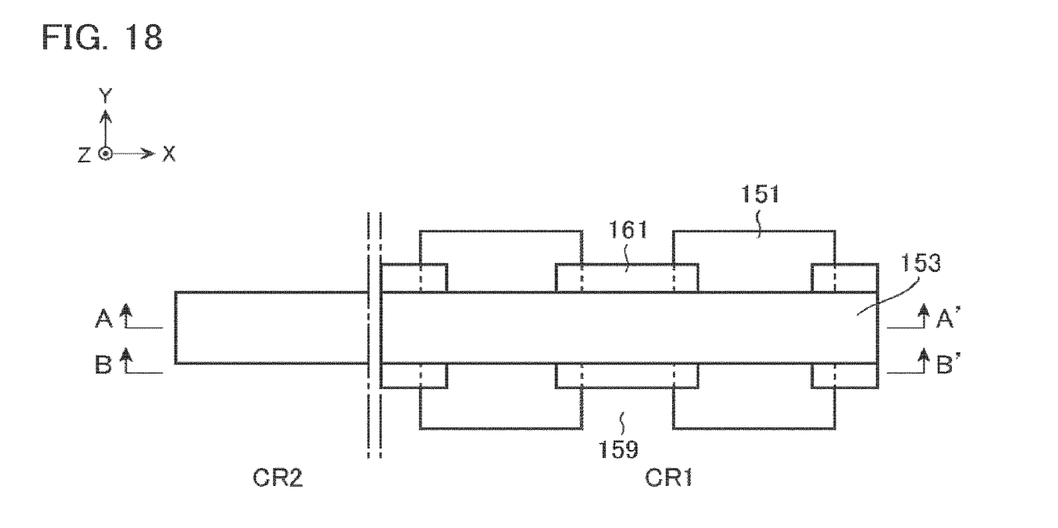
FIG. 18 is a schematic plan view illustrating the manufacturing method of the semiconductor device.
Figure 19:
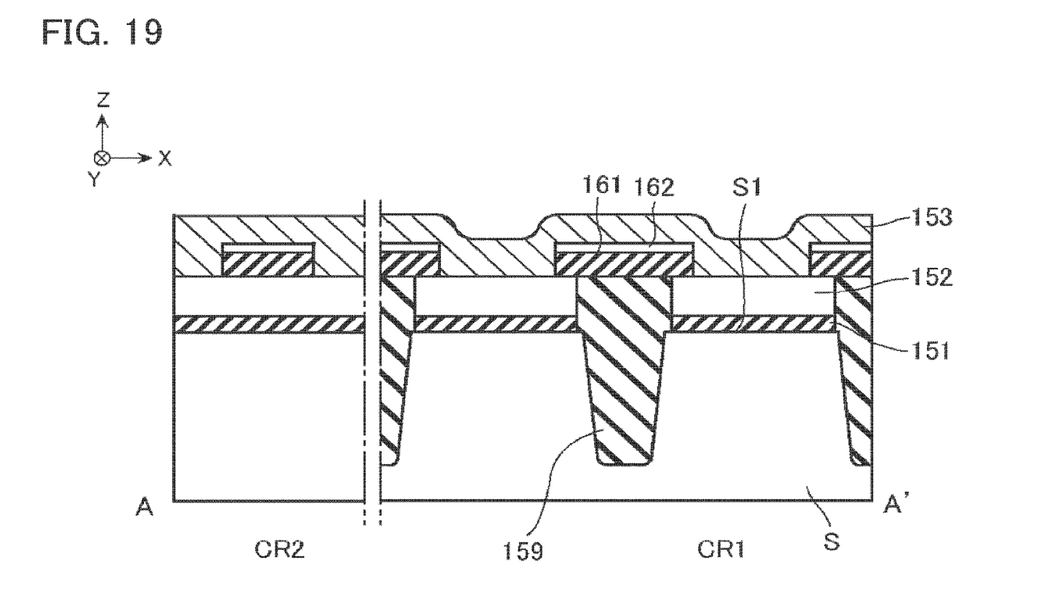
FIG. 19 is a schematic cross-sectional view illustrating the manufacturing method of the semiconductor device.

Next, after having removed the mask material 173, as illustrated in FIGS. 18 and 19, the conductive layer 153 extending in the X-direction is formed by, for example, a method such as CVD and RIE. At this time, the semiconductor layer 152 that is not covered by the insulating layer 161 is also etched, and thus, as illustrated in FIG. 9, the planar shape of the semiconductor layer 152 is formed into the hammerhead type.

Figure 20:
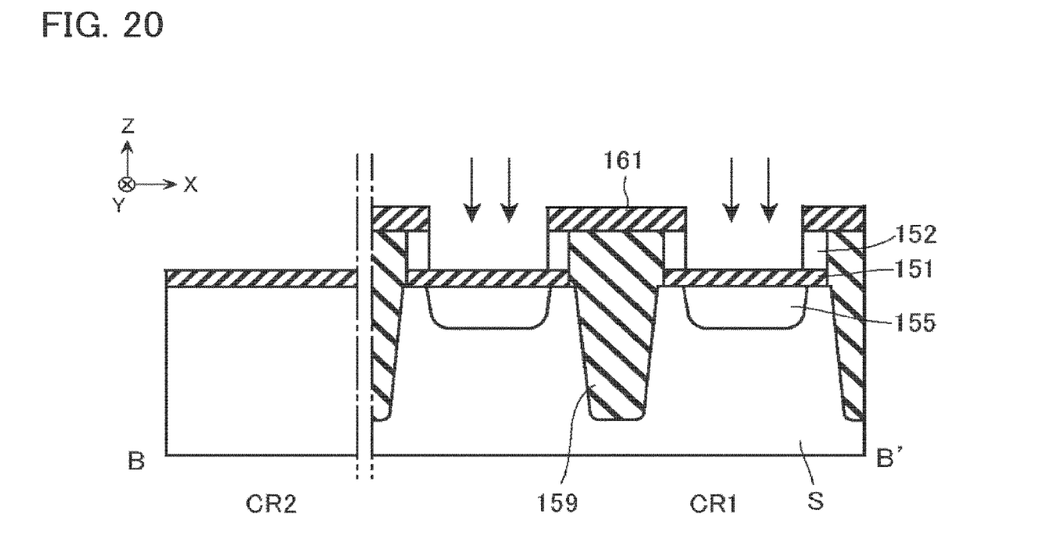
FIG. 20 is a schematic cross-sectional view illustrating the manufacturing method of the semiconductor device.

Next, as illustrated in FIG. 20, from above the insulating layer 151 exposed by RIE as described above, the N-type impurity, such as phosphorus (P), is doped on the surface of the semiconductor substrate S by, for example, a method such as ion implantation. Thus, the N-type impurity layers 155 and 156 are formed on a surface portion of the semiconductor substrate S.

Then, as illustrated in FIGS. 4 and 5, the semiconductor layer 162 and the conductive layer 153 on the insulating layer 161 of the second circuit region CR2 are removed, and the required contacts CS1 to CS4 are formed. The conductive layer 153 constituting the gate electrodes has end portions (not illustrated) where contacts (not illustrated) are connected.

With the above-described manufacturing method of the first embodiment, the transistors Tr and the passive elements, such as the resistor elements R, can be manufactured by the manufacturing process common to the first circuit region CR1 and the second circuit region CR2.

Second Embodiment

Figure 21:
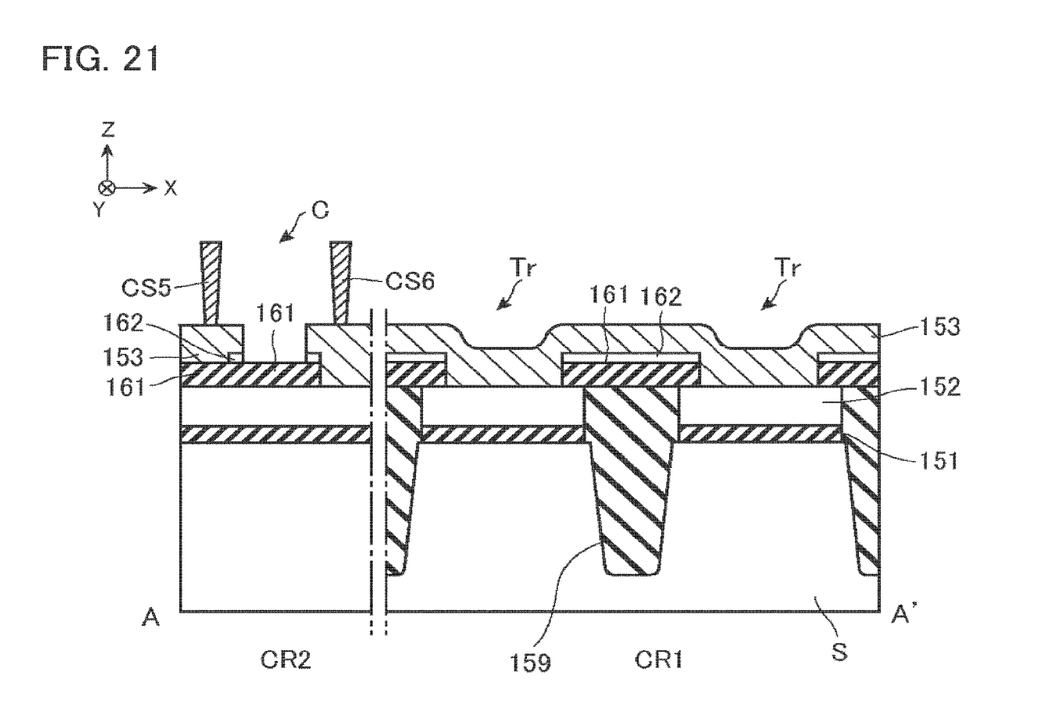
FIG. 21 is a schematic cross-sectional view of a semiconductor device according to a second embodiment.

FIG. 21 is a schematic cross-sectional view of a semiconductor device according to the second embodiment and corresponds to a cross-sectional view taken along the line A-A' in FIG. 4 and viewed in the arrow direction.

The semiconductor device according to the embodiment has a capacitive element C in the second circuit region CR2. The capacitive element C has: the insulating layer 161; the semiconductor layer 162, the conductive layer 153, and a contact CS5, which form one electrode of this insulating layer 161; and the semiconductor layer 152, the conductive layer 153, the semiconductor layer 162, and a contact CS6, which form the other electrode. Also in the embodiment, as described above, the capacitive element C can be manufactured in the same process as that of the transistor Tr.

Others

While the first and second embodiments have been described above, these embodiments have been presented by way of example, and are not intended to limit the scope of the inventions. These novel embodiments can be executed in a variety of other forms, and furthermore, various omissions, substitutions, and changes can be made without departing from the spirit of the inventions. For example, in the respective embodiments described above, the transistor Tr surrounded by the insulating layer 159 that constitutes the STI is one. However, for example, two transistors Tr that have common sources may be formed, and, for example, four cross shaped transistors Tr may be formed. While, in the respective embodiments described above, an N-channel type high voltage transistor that drives the semiconductor memory device has been taken as an example, in the respective embodiments described above, a P-channel type high voltage transistor can be applied by inverting a polarity. Furthermore, the respective embodiments described above can be applied to a low voltage P-type transistor or a low voltage N-type transistor. Further, the respective embodiments described above can be applied to a semiconductor device other than a semiconductor memory device. The accompanying claims and their equivalents are intended to cover these embodiments and their modifications as would fall within the scope and spirit of the inventions.

What is claimed is:

1. A semiconductor memory device comprising:
   a semiconductor substrate;
   a plurality of conductive films arranged in a stacking direction intersecting with a main surface of the semiconductor substrate;
   a semiconductor column extending in the stacking direction and being opposed to the plurality of conductive films;

an electric charge accumulating layer disposed between the plurality of conductive films and the semiconductor column;

a transistor formed on the semiconductor substrate;

a first insulating layer adjacent to the transistor in a first direction along the main surface of the semiconductor substrate, the first insulating layer extending in the stacking direction, at least a part of the first insulating layer being formed inside of the semiconductor substrate;

a first conductive layer connected to a gate of the transistor, a part of the first conductive layer being opposed to the first insulating layer;

a second insulating layer disposed between the first insulating layer and the first conductive layer; and a first semiconductor layer disposed between the second insulating layer and the first conductive layer, wherein a source of the transistor is electrically connected to one of the plurality of conductive films.

2. The semiconductor memory device according to claim 1, wherein a width in the first direction of the second insulating layer is greater than a width in the first direction of the first insulating layer.

3. The semiconductor memory device according to claim 1, wherein a width in a second direction of the second insulating layer is greater than a width in the second direction of the first conductive layer, the second direction intersecting with the first direction and being along the main surface of the semiconductor substrate.

4. The semiconductor memory device according to claim 1, wherein the transistor includes:

a third insulating layer disposed on the semiconductor substrate;

a second semiconductor layer disposed on the third insulating layer; and a first impurity layer and a second impurity layer disposed in the semiconductor substrate, wherein the first impurity layer is disposed on one side in a second direction with respect to the second semiconductor layer, the second direction intersecting with the first direction and being along the main surface of the semiconductor substrate, and the second impurity layer is disposed on the other side in the second direction with respect to the second semiconductor layer.

5. The semiconductor memory device according to claim 4, wherein the second insulating layer is disposed on the first insulating layer and the second semiconductor layer.

6. The semiconductor memory device according to claim 4, wherein a first transistor and a second transistor having same configurations as the transistor are disposed adjacent to one another in the first direction, and the first insulating layer is disposed between the first transistor and the second transistor.

7. The semiconductor memory device according to claim 6, wherein the second insulating layer has a rectangular shape viewed from a direction intersecting with the main surface of the semiconductor substrate and covers a part of the first insulating layer and parts of the second semiconductor layers on both sides in the first direction of the first insulating layer.

8. The semiconductor memory device according to claim 4, wherein the second semiconductor layer has a width in the second direction at a first position adjacent to the first insulating layer greater than a width of the second semiconductor layer in the second direction at a second position farther from the first insulating layer than the first position.

9. The semiconductor memory device according to claim 8, wherein the second semiconductor layer has an H-type shape viewed from a direction intersecting with the main surface of the semiconductor substrate.

10. The semiconductor memory device according to claim 4, further comprising a passive element, wherein the passive element includes:

a second conductive layer having parts separated in a direction along the main surface of the semiconductor substrate, the second conductive layer being formed in a same layer as the first conductive layer;

a fourth insulating layer disposed between the separated parts of the second conductive layer, the fourth insulating layer being formed in a same layer as the second insulating layer;

a third semiconductor layer disposed between the second conductive layer and the fourth insulating layer, the third semiconductor layer being formed in a same layer as the first semiconductor layer; and a fourth semiconductor layer connected to at least one of the separated parts of the second conductive layer, the fourth semiconductor layer being formed in a same layer as the second semiconductor layer.

* * * * *